United States Patent
Byun et al.

(10) Patent No.: US 10,989,984 B2
(45) Date of Patent: Apr. 27, 2021

(54) OPTICAL PHASED ARRAYS INCLUDING MEMBER TO CORRECT PHASE ERROR GENERATED IN MANUFACTURING PROCESSES AND METHOD OF CORRECTING PHASE USING THE SAME

(71) Applicant: SAMSUNG ELECTRONICS CO., LTD., Suwon-si (KR)

(72) Inventors: Hyunil Byun, Seongnam-si (KR); Inoh Hwang, Seongnam-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 0 days.

(21) Appl. No.: 16/778,852

(22) Filed: Jan. 31, 2020

(65) Prior Publication Data
US 2021/0063842 A1 Mar. 4, 2021

(30) Foreign Application Priority Data

Aug. 28, 2019 (KR) ........................ 10-2019-0106132

(51) Int. Cl.
| | | |
|---|---|---|
| G02F 1/295 | (2006.01) | |
| H01Q 3/30 | (2006.01) | |
| H01Q 3/26 | (2006.01) | |
| G02B 27/00 | (2006.01) | |
| G02F 1/313 | (2006.01) | |
| H01S 5/40 | (2006.01) | |
| G02F 1/29 | (2006.01) | |

(52) U.S. Cl.
CPC ....... *G02F 1/2955* (2013.01); *G02B 27/0087* (2013.01); *G02F 1/292* (2013.01); *G02F 1/3137* (2013.01); *H01Q 3/2676* (2013.01); *H01Q 3/30* (2013.01); *H01S 5/4075* (2013.01)

(58) Field of Classification Search
None
See application file for complete search history.

(56) References Cited

U.S. PATENT DOCUMENTS

| | | |
|---|---|---|
| 9,031,163 B2 | 5/2015 | Matsuo et al. |
| 9,341,516 B2 | 5/2016 | Zhu et al. |

(Continued)

FOREIGN PATENT DOCUMENTS

| | | |
|---|---|---|
| JP | 2004-294223 A | 10/2004 |
| JP | 5736545 B2 | 6/2015 |
| KR | 10-2018-0070325 A | 6/2018 |

OTHER PUBLICATIONS

"Phased array", Wikipedia; Retrieved from URL: <https://en.wikipedia.org/w/index.php?title=Phased_array&oldid=961349041>, Last edited Jun. 7, 2020, 8 pages.

(Continued)

*Primary Examiner* — Jerry Rahll
(74) *Attorney, Agent, or Firm* — Sughrue Mion, PLLC

(57) ABSTRACT

Provided is an optical phased array including a light injector, a first splitter connected to the light injector, a first phase shifter connected to the first splitter, a plurality of waveguides connected to the first splitter, portions of the plurality of waveguides being connected to the first splitter via the first phase shifter, an antenna array connected to the plurality of waveguides, a single mode filter provided in each of the plurality of waveguides, and a first photodetector connected to the first splitter and configured to detect a portion of light radiated onto the antenna array.

29 Claims, 10 Drawing Sheets

(56) References Cited

U.S. PATENT DOCUMENTS

| | | |
|---|---|---|
| 9,989,831 B2 | 6/2018 | Pruessner et al. |
| 10,074,901 B2 | 9/2018 | Byun et al. |
| 10,859,683 B2 * | 12/2020 | Lin .................. G01S 7/4972 |
| 2003/0002790 A1 | 1/2003 | Johnson et al. |
| 2016/0139266 A1 * | 5/2016 | Montoya ............ G01S 17/32 |
| | | 356/5.01 |
| 2017/0244165 A1 * | 8/2017 | Ghelfi ................ H01Q 3/2676 |
| 2018/0039153 A1 | 2/2018 | Hashemi et al. |
| 2018/0039154 A1 | 2/2018 | Hashemi et al. |
| 2018/0059507 A1 * | 3/2018 | Kim ..................... G02F 1/2955 |
| 2018/0107091 A1 | 4/2018 | Hosseini et al. |
| 2018/0120422 A1 | 5/2018 | Fujita et al. |
| 2018/0175501 A1 | 6/2018 | Byun et al. |
| 2018/0217472 A1 | 8/2018 | Poulton et al. |
| 2018/0252983 A1 | 9/2018 | Pruessner et al. |
| 2019/0391459 A1 * | 12/2019 | Shin .................... G02F 1/2955 |

OTHER PUBLICATIONS

L. Soldano et al., "Optical Multi-Mode Interference Devices Based on Self-Imaging: Principles and Applications", Journal of Lightwave Technology, vol. 13, No. 4, IEEE, Apr. 1995, pp. 615-627.

T. Komljenovic et al., "On-chip calibration and control of optical phased arrays", Optics Express, vol. 26, No. 3, Jan. 30, 2018, pp. 3199-3210.

Karel Van Acoleyen et al., "Off-chip beam steering with a one-dimensional optical phased array on silicon-on-insulator", Optics Letters, May 1, 2009, vol. 34, No. 9, pp. 1477-1479, XP055587154.

Kuanping Shang et al., "Uniform emission, constant wavevector silicon grating surface emitter for beam steering with ultra-sharp instantaneous field-Of-view", Optics Express, Aug. 21, 2017, vol. 25, No. 17, pp. 19655-19661, XP055766795.

Communication issued Jan. 29, 2021 by the European Patent Office in European Patent Application No. 20162065.5.

* cited by examiner

OPTICAL PHASED ARRAYS INCLUDING MEMBER TO CORRECT PHASE ERROR GENERATED IN MANUFACTURING PROCESSES AND METHOD OF CORRECTING PHASE USING THE SAME

CROSS-REFERENCE TO RELATED APPLICATION

This application claims priority to Korean Patent Application No. 10-2019-0106132, filed on Aug. 28, 2019 in the Korean Intellectual Property Office, the disclosure of which is incorporated herein in its entirety by reference.

BACKGROUND

1. Field

Example embodiments of the present disclosure relate to optical phased arrays, and more particularly, to optical phased arrays including a member for correcting, a phase error generated in a manufacturing process and a method of correcting a phase using the same.

2. Description of Related Art

A phased array includes a number of constituent elements that emit phase-controlled electromagnetic waves. The phased array is a device that may cause a destructive and constructive interference phenomenon by appropriately controlling a phase difference between the constituent elements to control a radiation angle of an electromagnetic wave in a desired direction.

An optical phased array (OPA) refers to a phased array that operates with respect to a short wavelength of an electromagnetic wave of a few μm or less, that is, with respect to an optical signal. An OPA may control a radiation angle of an optical signal only by an electric signal without mechanical movement, and thus, high speed and high reliability beam steering may be formed. An OPA may also be used for autonomous driving light detection and ranging (LiDAR).

An OPA may be formed in several ways. For example, an OPA may be formed by forming members constituting the OPA on a silicon or silicon oxide ($SiO_2$) substrate by using a semiconductor process. The members may be formed in an integrated form. An OPA formed in this form is referred to as an OPA chip.

The OPA includes a light source and light is split into N channels through an optical splitter. The light source may be buried in an OPA chip or may be input through an optical fiber etc. from the outside of the OPA chip. Each split channel consists of a phase shifter and an antenna. The phase shifter provides different phase differences to each of the N channels. Optical signals with different phases in each channel are interfered through an antenna array, and thus, become a single beam having directivity. The direction in which the beam is emitted may vary according to a phase difference condition between channels.

SUMMARY

One or more example embodiments provide OPAs that may relatively simply perform an OPA phase correction.

One or more example embodiments also provide OPAs that may relatively rapidly perform an OPA phase correction.

One or more example embodiments also provide OPAs that may increase reliability with respect to an OPA phase correction.

One or more example embodiments also provide methods of rapidly and reliably performing an OPA phase correction by using the OPAs.

Additional aspects will be set forth in part in the description which follows and, in part, will be apparent from the description, or may be learned by practice of the example embodiments.

According to an aspect of an example embodiment, there is provided an optical phased array (OPA) including a light injector, a first splitter connected to the light injector, a first phase shifter connected to the first splitter, a plurality of waveguides connected to the first splitter, portions of the plurality of waveguides being connected to the first splitter via the first phase shifter, an antenna array connected to the plurality of waveguides, a single mode filter provided in each of the plurality of waveguides, and a first photodetector connected to the first splitter and provided to detect a portion of light radiated onto the antenna array.

The OPA may further include a plurality of splitters provided between the first splitter and the plurality of waveguides, and a plurality of photodetectors connected to the plurality of splitters.

The OPA may further include a plurality of phase shifters provided between the plurality of splitters.

The OPA, wherein one waveguide and the first photodetector may be connected to a first side of the first splitter through which light enters and exits, wherein two waveguides are connected to a second side of the first splitter and diverge from the first splitter, wherein a first phase shifter is provided on one of the two waveguides.

The OPA, wherein one waveguide and a photodetector may be connected to a first side of each of the plurality of splitters through which light enters and exits, and wherein two waveguides are connected to a second side of each of the plurality of splitters and diverge from each of the plurality of splitters.

The first photodetector may include a first light receiving element and a second light receiving element respectively provided on both sides of the waveguide The photodetector connected to the first side of each of the plurality of splitter may include a first light receiving element and a second light receiving element provided on both sides of the one waveguide.

The plurality of photodetectors may be provided at positions configured to receive light deviated from the waveguide while light radiated to the antenna array passes through the plurality of splitters through the plurality of waveguides.

The single mode filter may be integrated to the each of the plurality of waveguides.

The single mode filter may include a first section having a first width, a second section having a second width, and a third section having a third width, wherein the first width, the second width, and the third width are different from each other.

The OPA, wherein one waveguide and a photodetector may be connected to a first side of each of the plurality of splitters through which light enters and exits, and two waveguides are connected to a second side of each of the plurality of splitters and diverge from each of the plurality of splitters, and wherein each of the plurality of phase shifters is provided in one of the two waveguides diverging from each of the plurality of splitters.

The OPA, wherein a number of the plurality of phase shifters and a number of the plurality of splitters may be equal, or the number of the plurality of phase shifters may be greater than the number of the plurality of splitters provided between the light injector and the antenna array.

When the number of the plurality of phase shifters is greater than the number of the plurality of splitters, the plurality of phase shifters may be provided in each of the plurality of waveguides provided between the first splitter and the antenna array.

The OPA may further include heat shielding elements provided around the first phase shifter and each of the plurality of phase shifters.

The OPA, wherein one waveguide may be connected to a first side of each of the plurality of splitters through which light enters and exits, and two waveguides may be connected to a second side of each of the plurality of splitters and diverge from each of the plurality of splitters, and wherein a tap coupler may be provided adjacent to the one waveguide connected to the first side of each of the plurality of splitters.

According to another aspect of an example embodiment, there is provided an optical phased array (OPA) including a light receiver, a first splitter connected to the light receiver, a first phase shifter connected to the first splitter, a plurality of waveguides connected to the first splitter, portions of the plurality of waveguides being connected to the first splitter via the first phase shifter, an antenna array connected to the plurality of waveguides, and a single mode filter provided in each of the plurality of waveguides.

The OPA may further include a plurality of splitters provided between the first splitter and the plurality of waveguides, and a plurality of photodetectors connected to the plurality of splitters.

The OPA may further include a plurality of phase shifters provided between the plurality of splitters.

The OPA, wherein one waveguide may be connected to a first side of the first splitter through which light enters and exits, and two waveguides may be connected to a second side of the first splitter and diverge from the first splitter, wherein a first phase shifter may be provided on one of the two waveguides diverging from the first splitter.

The OPA, wherein one waveguide and a photodetector may be connected to a first side of each of the plurality of splitters through which light enters and exits, and two waveguides may be connected to a second side of each of the plurality of splitters and diverge from each of the plurality of splitters.

The photodetector connected to the first side of each of the plurality of splitters may include a first light receiving element and a second light receiving element respectively provided on each side of the one waveguide.

The plurality of photodetectors may be provided at positions configured to receive light deviated from a waveguide while light radiated to the antenna array passes through the plurality of splitters through the plurality of waveguides.

The single mode filter may be integrated to each of the plurality of waveguides.

The single mode filter may include a first section having a first width, a second section having a second width, and a third section having a third width, wherein the first width, the second width, and the third width are different from each other.

The OPA, wherein one waveguide and a first photodetector may be connected to a first side of each of the plurality of splitters through which light enters and exits, and two waveguides may be connected to a second side of each of the plurality of splitters and diverge from each of the plurality of splitters, and wherein each of the plurality of phase shifters may be provided in one of the two waveguides diverging from each of the plurality of splitters.

A number of the plurality of phase shifters and a number of the plurality of splitters may be equal, or the number of the plurality of phase shifters may be greater than the number of the plurality of splitters provided between the light injector and the antenna array.

When the number of the plurality of phase shifters is greater than the number of the plurality of splitters, the phase shifters may be provided in each of the plurality of waveguides provided between the first splitter and the antenna array.

The OPA may further include heat shielding elements provided around the first phase shifter and each of the plurality of phase shifters.

The OPA, wherein one waveguide may be connected to a first side of each of the plurality of splitters through which light enters and exits, and two waveguides may be connected to a second side of each of the plurality of splitters and diverge from each of the plurality of splitters, and wherein a tap coupler may be provided adjacent to the one waveguide connected to the first side of each of the plurality of splitters.

According to yet another aspect of an example embodiment, there is provided a method of correcting an optical phased array (OPA) phase error, the method including radiating light to an antenna array of an OPA from outside the OPA, measuring an electrical signal corresponding to at least a portion of radiated light at a first location which is provided at a first distance along a waveguide from the antenna array, obtaining a phase correction value based on the measured electrical signal, applying the obtained phase correction value to the OPA.

The measuring of the electrical signal may be simultaneously performed with respect to a plurality of waveguides included in the OPA.

The measuring of the electrical signal may include measuring an electrical signal corresponding to light deviating from a channel provided at a first position based on a phase difference between two adjacent waveguides through which the radiated light is transmitted.

The measuring of the electrical signal may include measuring an electrical signal emitted from a photodetector provided at a first position and configured to receive at least a portion of the light.

After the phase correction is completed at a first position, when the OPA is normally operated, the method may be repeated at a second position between a light injector into which light is injected and the first position.

The photodetector may include a first light receiving element and a second light receiving element respectively connected to a splitter provided at the first position.

The photodetector may include a tap coupler provided adjacent to the waveguide.

When measuring an electrical signal at the second position, the measurements may be simultaneously performed with respect to a plurality of waveguides provided between the first position and the second position.

After phase correction is completed at the second position, the method may be repeated at a third position between the light injector and the second position.

Phase shifters may be provided on each of the plurality of waveguides.

A number of a plurality of splitters and a number of a plurality of phase shifters may be provided between the light injector and the antenna array, the number of the plurality of splitters and the number of the plurality of phase shifters being equal.

A heat shielding element may be provided on each of the phase shifters.

A single mode filter is provided in each of the plurality of waveguides.

The single mode filter may be integrated to each of the plurality of waveguides.

The single mode filter may include a first section having a first width, a second section having a second width, and a third section having a third width, wherein the first width, the second width, and the third width are different from each other.

BRIEF DESCRIPTION OF THE DRAWINGS

The above and/or other aspects, features, and advantages of example embodiments of the disclosure will be more apparent from the following description taken in conjunction with the accompanying drawings, in which.

DETAILED DESCRIPTION

Figure 1:
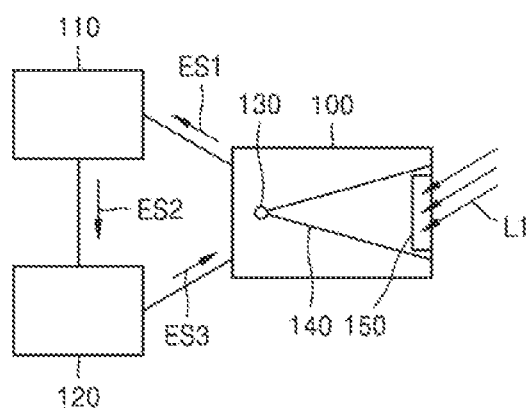
FIG. 1 is a block diagram illustrating a concept of a correction method with respect to a phase error generated during an optical phased array (OPA) manufacturing process according to an example embodiment.

Reference will now be made in detail to example embodiments of which are illustrated in the accompanying drawings, wherein like reference numerals refer to like elements throughout. In this regard, the example embodiments may have different forms and should not be construed as being limited to the descriptions set forth herein. Accordingly, the example embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c. Throughout the specification, when a portion "includes" an element, another element may be further included, rather than excluding the existence of the other element, unless otherwise described.

In an ideal optical phased array (OPA) chip, if waveguide lengths of all channels are matched and no voltage is applied to a phase shifter, that is, no phase modulation occurs, beams emitted from an antenna array are gathered and radiated in a direction parallel to the waveguide propagation direction.

However, in an actually manufactured OPA, widths of the waveguides have an error within several nm along a traveling direction. Therefore, there is an error between the optical path of the actually manufactured waveguides of OPA and its design value.

In general, when the length of a waveguide is several hundred μm or more, the phase change due to the process error becomes random within a range of 0 to $2\pi$, that is, the prediction of the process error is difficult. As a result, even if the lengths of all channels are matched in a design stage, beams may not be converged in one direction due to process errors in a manufacturing process. Therefore, a driving condition of N phase shifters for emitting beams at a desired radiation angle needs to be determined. However, in the case of a method in which the driving condition of the phase shifters is changed after observing a beam shape through a camera of the related art, a relatively expensive infrared camera is generally used.

In addition, in a method of the related art, an output beam shape is optimized by individually controlling phase shifters of each channel of the OPA chip. However, there is a problem that the correction time also exponentially increases as the number of phase shifters is increased, for example, by dozens or hundreds or more.

The OPA phase error correction method according to example embodiments may improve or solve these problems, and correct a phase error generated during a manufacturing process without using a camera, inject light into an area where light is emitted from an OPA chip, and measure an electrical signal generated from the OPA chip.

Hereinafter, an optical phased array including a member for correcting a phase error generated in a manufacturing process and a method of correcting a phase error by using the same will be described in detail with reference to the accompanying drawings. In this process, thicknesses of the layers or regions illustrated in the drawings may be exaggerated for clarity.

First, the concept of the correction method with respect to a phase error generated in an OPA manufacturing process according to an example embodiment will be described.

As depicted in FIG. 1, light may be irradiated or injected into an antenna region 150 of an optical phased array region 140 of an OPA chip 100 at a given angle of incidence. The antenna region 150 may include an antenna array. Light L1 injected into the antenna region 150 is transmitted along an optical waveguide (channel) in the optical phased array region 140 in a direction opposite to a direction in which light is transmitted when the OPA chip 100 is normally operated in a light emission mode when a phase error correction is completed. When the light L1 is transmitted through the waveguides, in which a phase error generated during the manufacturing process presents, among the waveguides of the optical phased array region 140, some light may be emitted to the outside of a region where the corresponding waveguides meet each other due to a phase error. Light emitted to the outside is detected by a photodetector capable of photoelectric conversion. The photodetector may be, for example, a photodiode or include a photodiode. An electrical signal ES1 corresponding to detected light is generated from the photodetector. That is, a photoelectric conversion signal corresponding to the phase error is generated from the OPA chip 100. The electrical signal ES1 corresponding to the photoelectric conversion signal is transmitted to a signal processor 110 connected to the OPA chip 100. The signal processor 110 calculates a phase correction value required to remove the phase error based on the electrical signal ES1 and transmits a signal ES2 corresponding to the phase correction value to a phase tuner 120. The phase tuner 120 transmits a phase correction value ES3 to the OPA chip 100 according to the signal ES2 corresponding to the transmitted phase correction value. The phase of a phase shifter included in the optical phase array region 140 is controlled by the phase correction value ES3 transmitted from the phase tuner 120. The above process may be repeated until the phase error is removed or the phase error is lowered to a desired level. In FIG. 1, reference numeral 130 may be a light source or a light injection unit (or light injector) into which light is injected.

Figure 2:
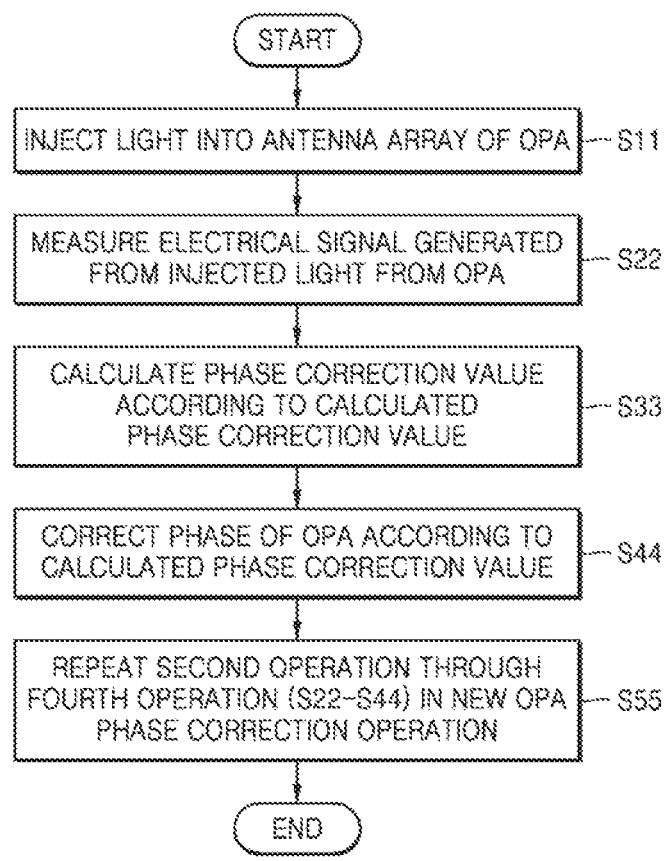
FIG. 2 is a flow diagram illustrating a method of correcting a phase error generated during an OPA manufacturing process according to an example embodiment.

FIG. 2 illustrates a flowchart of a method of correcting a phase error generated in an OPA manufacturing process based on the phase error correction method as illustrated in FIG. 1, hereinafter, an OPA correction method according to an example embodiment, according to an example embodiment.

Referring to FIG. 2, in the OPA correction method according to an example embodiment, first, light is injected into an antenna array of a correction target OPA (S11). The light injected in the first operation S11 may be light that belongs to a wavelength range of light injected into a light injection unit of an OPA, a phase correction of which is completed. For example, when an OPA is normally operated, assuming that the light injected into the light injection unit uses infrared rays that belong to a specific wavelength range, the light injected into the antenna array in the first operation S11 may also be infrared rays that belong to the specific wavelength range. For example, the light injected into the antenna array in the first operation S11 may be a laser of an infrared band. When injecting light into an antenna array, if a collimator is used, the entire antenna array may be uniformly irradiated by light. The light injection may also be applied to an OPA described later.

Next, regardless of whether the OPA has or does not have the phase error, light injected into the antenna array is transmitted into the OPA in a reverse process of a process in which light emitted from a light source is radiated through the antenna array through a plurality of waveguide channels when the OPA is normally operated. The injected light is light transmitted from the antenna array toward the light source along a plurality of channels included in the OPA, and in this process, an electrical signal according to photoelectric conversion of at least a portion of the injected light may be generated regardless of a phase difference between light transmitted along each channel. A magnitude of the generated electrical signal when there is a phase difference and when there is no phase difference between the light transmitted along each channel may be different. Also, when there is a phase difference between light transmitted along each channel, the magnitude of the generated electrical signal may be different according to the magnitude of the phase difference.

In this way, as the light injected in the first operation S11 is transmitted into the OPA, an electrical signal is generated from the OPA, and the electrical signal includes information on whether the OPA has a phase error generated in the manufacturing process and information on how much the phase error is if there is a phase error. Accordingly, information on the phase error of the OPA may be obtained through measuring the electrical signal. A second operation is measuring the electrical signal from the OPA (S22).

A third operation is to calculate a phase correction value for correcting the phase error of the OPA after determining whether there is a phase error of the OPA and the degree of the phase error by analyzing the electrical signal measured in the second operation S22 (S33).

That is, in the third operation S33, if it is determined that the OPA has a phase error based on the measured electrical signal, when the light injected for correcting the phase error is transmitted through each channel, the amount that the phase of the injected light should be corrected is analyzed, and according to the analysis, an electrical signal value (phase correction value) to be applied to a phase shifter included in the OPA for correcting the phase of the injected light passing through each channel is calculated.

In a fourth operation, the phase correction value calculated as above is applied to the OPA to correct the phase of the OPA (S44). As a result, a phase error generated in a manufacturing process of the OPA may be corrected. The phase error of the OPA may be eliminated through a single phase correction to the OPA or lowered to a desired level. As the phase error of the OPA may be generated in all of the plurality of channels included in the OPA, the phase correction with respect to the OPA may be correcting the phase error generated in the channel of some section of the plurality of channels included in the OPA. The phase correction processes for correcting a phase error on channels of the remaining sections of the plurality of channels should be continuously performed.

Then the phase correction is repeated. If the phase correction process with respect to the OPA performed in the fourth operation S44 is referred to as a first phase correction process, the second and third phase correction processes may be subsequently performed in the first through fourth operations (S11 through S44), in other words, the first phase correction process may be repeatedly performed.

The OPA correction method according to an example embodiment will further be described in the description of the OPA including a member for correcting a phase error generated in the manufacturing process.

Figure 3:
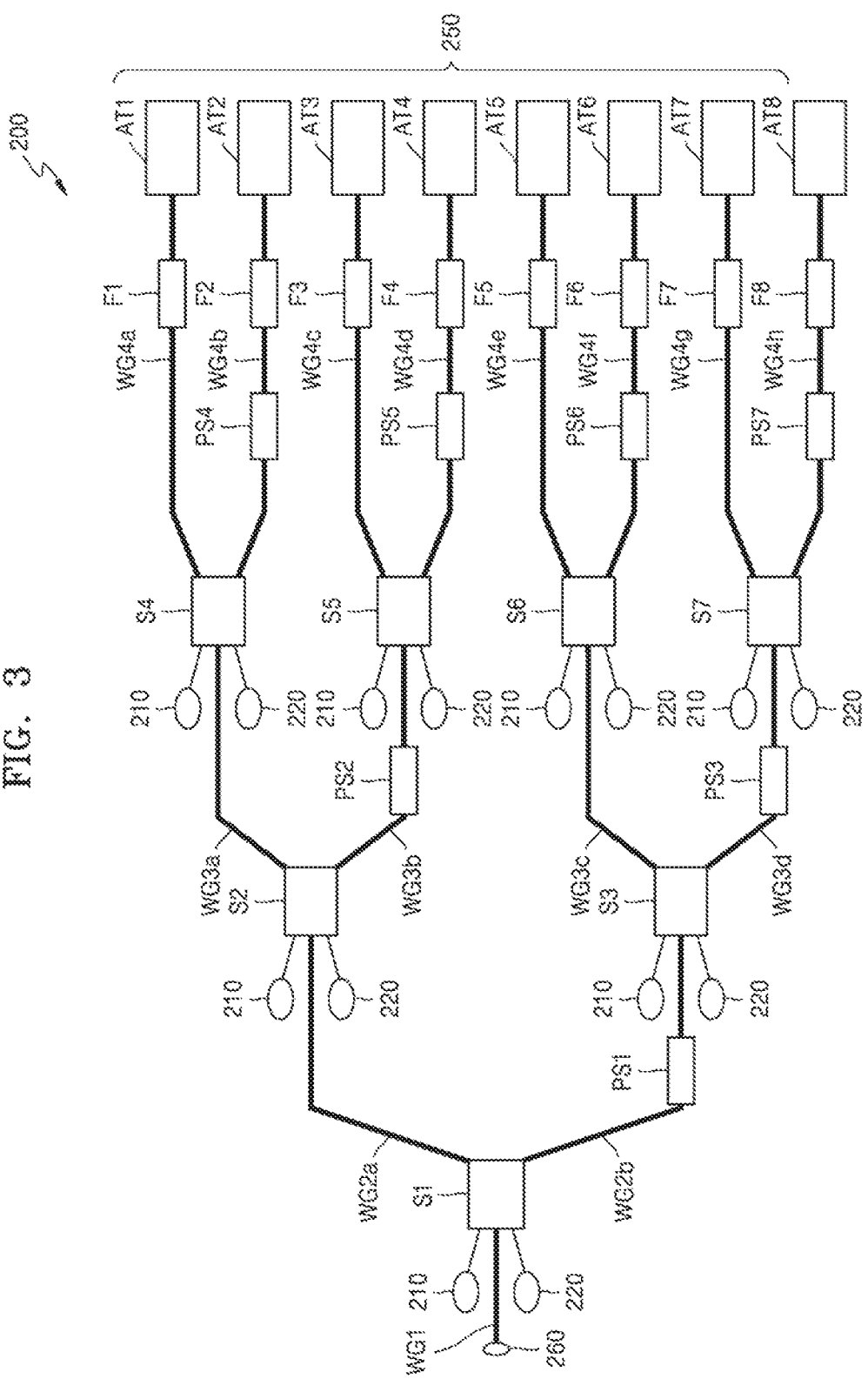
FIG. 3 is a plan view illustrating a first OPA including a member for correcting a phase error generated during a manufacturing process according to an example embodiment.

FIG. 3 shows a first OPA 200 according to an example embodiment.

Referring to FIG. 3, the first OPA 200 according to an example embodiment includes a light injection unit 260 and an antenna grating array an antenna array 250. Between the light injection unit 260 and the antenna array 250, a plurality of optical waveguides WG1, WG2a, WG2b, WG3a to WG3d, WG4a to WG4h, a plurality of optical splitters S1 through S7, a plurality of phase shifters PS1 through PS7, a plurality of light receiving elements 210 and 220, and a plurality of single mode filters F1 through F8 are provided. The light injection unit 260 is an area into which light is injected when the OPA is normally operated. Light injected into the light injection unit 260 may be light of an infrared band region. The light injection unit 260 may be one end of a first optical waveguide WG1 or the light injection unit 260 may be a unit connected to one end of the first optical waveguide WG1. The first optical splitter S1 is provided at the other end of the first optical waveguide WG1. A second optical waveguide WG2a and a third optical waveguide WG2b are diverged from a first optical splitter S1. A second optical splitter S2 is connected to the other end of the second optical waveguide WG2a, and a third optical splitter S3 is connected to the other end of the third optical waveguide WG2b. The second optical waveguide WG2a is disposed between the first optical splitter S1 and the second optical splitter S2, and the third optical waveguide WG2b is disposed between the first optical splitter S1 and the third optical splitter S3. A first phase shifter PS1 is disposed on the third optical waveguide WG2b. The first phase shifter PS1 may be configured to control the refractive index of a portion of the third optical waveguide WG2b passing through the first phase shifter PS1. In an example, the first phase shifter PS1 may be configured to change a temperature of a portion of the third optical waveguide WG2b passing through the first phase shifter PS1. Due to the temperature change of the portion of the third optical waveguide WG2b passing through the first phase shifter PS1, the refractive index of the corresponding portion is changed, and as a result, the phase of light transmitted through the third optical waveguide WG2b may be controlled. In another example, the first phase shifter PS1 may be configured to control a carrier density supplied to a portion of the third optical waveguide WG2b passing through the first phase shifter PS1. When the carrier density supplied to the portion passing through the first phase shifter PS1 is changed, the refractive index of the portion of the third optical waveguide WG2b passing through the first phase shifter PS1 is changed. Accordingly, the phase of light transmitted through the third optical waveguide WG2b may be controlled through controlling the carrier density supplied to the portion of the third optical waveguide WG2b passing through the first phase shifter PS1. The carrier density may include an electron density or a hole density. As an example, the first phase shifter PS1 may be provided as a PIN diode, a PN diode, or a capacitor. The above descriptions of the first phase shifter PS1 may also be applied to the phase shifters described below.

The second optical waveguide WG2a is diverged to fourth optical waveguide WG3a and the fifth optical waveguide WG3b from the second optical splitter S2. The fourth optical waveguide WG3a and the fifth optical waveguide WG3b are separated from each other. A fourth optical splitter S4 is connected to an end of the fourth optical waveguide WG3a. A fifth optical splitter S5 is connected to an end of the fifth optical waveguide WG3b. A second phase shifter PS2 is disposed on the fifth optical waveguide WG3b between the second optical splitter S2 and the fifth optical splitter S5.

The third optical waveguide WG2b is diverged to the sixth optical waveguide WG3c and the seventh optical waveguide WG3d from the third optical splitter S3. The sixth optical waveguide WG3c and the seventh optical waveguide WG3d are separated from each other. A sixth optical splitter S6 is connected to an end of the sixth optical waveguide WG3c. A seventh optical splitter S7 is connected to an end of the seventh optical waveguide WG3d. A third phase shifter PS3 is disposed on the seventh optical waveguide WG3d between the third optical splitter S3 and the seventh optical splitter S7.

The fourth optical waveguide WG3a is diverged to the eighth optical waveguide WG4a and the ninth optical waveguide WG4b from the fourth optical splitter S4. Lengths of the eighth optical waveguide WG4a and the ninth optical waveguide WG4b may be the same. The eighth optical waveguide WG4a and the ninth optical waveguide WG4b are parallel to each other and separated from each other. The first antenna AT1 and the second antenna AT2 respectively are connected to ends of the eighth optical waveguide WG4a and the ninth optical waveguide WG4b. When the OPA is normally operated, light transmitted through the eighth optical waveguide WG4a through the fourth optical splitter S4 may be emitted at a given angle through the first antenna AT1. Also, light transmitted through the ninth optical waveguide WG4b through the fourth optical splitter S4 may be emitted at a given angle through the second antenna AT2.

When the first OPA 200 is used as a phase correction device for correcting a phase error generated in a manufacturing process, similar to the incident light L1 shown in FIG. 1, light enters the first antenna AT1 and the second antenna AT2 from the outside of the first OPA 200. At this time, when a beam size of external light incident on the first antenna AT1 and the second antenna AT2 is less than the sizes of the first antenna AT1 and the second antenna AT2, the deviation of phase correction accuracy between the channels connected to the first antenna AT1 and the second antenna AT2 may be increased. Accordingly, the beam size of the external light incident on the first antenna AT1 and the second antenna AT2 may be equal to or greater than an area of the first antenna AT1 and the second antenna AT2. This relationship between the first antenna AT1 and the second antenna AT2 and the external light incident thereto may be applied to other antennas and the antenna array 250. Light incident on the first antenna AT1 and the second antenna AT2 is transmitted in a direction opposite to the direction when the first OPA 200 is normally operated. That is, light incident on the first antenna AT1 and the second antenna AT2 respectively is transmitted through the eighth optical waveguide WG4a and the ninth optical waveguide WG4b and is combined in the fourth optical splitter S4 located at a first distance from the first antenna AT1 and the second antenna AT2, and afterwards, the light reaches the first optical waveguide WG1 through the fourth optical waveguide WG3a, the second optical splitter S2 located at a second distance from the first antenna AT1 and the second antenna AT2, the second optical waveguide WG2a, and the first optical splitter S1 located at a third distance from the first antenna AT1 and the second antenna AT2.

The first antenna AT1 and the second antenna AT2 may be gratings, and may provide only a basic mode or the basic mode and a higher order mode together according to a width of the antennas. As a result, light incident on the first antenna AT1 and the second antenna AT2 may be transmitted through the eighth optical waveguide WG4a and the ninth optical waveguide WG4b as single mode light, or may be transmitted through the eighth optical waveguide WG4a and the ninth optical waveguide WG4b as light including single mode light and multi-mode light. The multi-mode light may be filtered through the first single mode filter F1 and the second single mode filter F2 respectively provided in the eighth optical waveguide WG4a and the ninth optical waveguide WG4b. For example, the multi-mode light may be scattered and disappeared to the outside of the eighth optical waveguide WG4a and the ninth optical waveguide WG4b while passing through the first single mode filter F1 and the second single mode filter F2. Therefore, the single mode light transmitted through the eighth optical waveguide WG4a and the ninth optical waveguide WG4b is collected in the fourth optical splitter S4. The single mode light incident on the fourth optical splitter S4 through the eighth optical waveguide WG4a and the ninth optical waveguide WG4b is divided into modes of several orders and the modes are diverged to any number through intersection with each other. Afterwards, main light is transmitted to the second optical splitter S2 through the fourth optical waveguide WG3a, and multi-mode light is transmitted to the first light receiving element 210 and the second light receiving element 220 that are capable of photoelectric conversion and connected to the fourth optical splitter S4. Accordingly, an electric signal corresponding to the generated multi-mode light may be generated from the first light receiving element 210 and the second light receiving element 220. The electrical signal may be used to analyze a phase difference and the degree of phase difference between light transmitted through the eighth optical waveguide WG4a and the ninth optical waveguide WG4b. The second optical splitter S2 and the first optical splitter S1 may also perform the same process as the fourth optical splitter S4. As a result, single mode light may be transmitted to the first optical waveguide WG1. The second distance is greater than the first distance, and the third distance is greater than the second distance.

The first single mode filter F1 is provided in the eighth optical waveguide WG4a between the fourth optical splitter S4 and the first antenna AT1. The multi-mode light included in the external light injected into the first antenna AT1 may be filtered by the first single mode filter F1. Therefore, when a light injected into the first antenna AT1 is transmitted to the fourth optical splitter S4 through the first single mode filter F1 in a process of performing the phase error correction, only single mode light may be delivered to the fourth optical splitter S4. The first single mode filter F1 may be provided to deliver only single mode light to the fourth optical splitter S4. In an example, the first single mode filter F1 may be a portion of the eighth optical waveguide WG4a and may be a modified portion of the eighth optical waveguide WG4a to perform as a single mode filter. This will be described later. In another example, the first single mode filter F1 may be an independent filter connected to the eighth optical waveguide WG4a as a single mode filter. The first single mode filter F1 may be disposed closer to the first antenna AT1 than the fourth optical splitter S4. The descriptions about the first single mode filter F1 may be applied to other single mode filters described below.

The fourth phase shifter PS4 and the second single mode filter F2 are provided on the ninth optical waveguide WG4b between the fourth optical splitter S4 and the second antenna AT2. The second single mode filter F2 may be located between the fourth phase shifter PS4 and the second antenna AT2.

The fifth optical waveguide WG3b is diverged to the tenth optical waveguide WG4c and eleventh optical waveguide WG4d from the fifth optical splitter S5. The tenth optical waveguide WG4c and the eleventh optical waveguide WG4d are parallel to each other and separated from each other. The length of the tenth optical waveguide WG4c is the same as that of the eleventh optical waveguide WG4d The length of the tenth optical waveguide WG4c may be the same as that of the ninth optical waveguide WG4b. A third antenna AT3 is connected to an end of the tenth optical waveguide WG4c and a fourth antenna AT4 is connected to an end of the eleventh optical waveguide WG4d. A third single mode filter F3 is provided on the tenth optical waveguide WG4c provided between the fifth optical splitter S5 and the third antenna AT3, where the fifth optical splitter S5 is located at the first distance from the third antenna AT3 and the fourth antenna AT4. The fifth phase shifter PS5 and the fourth single mode filter F4 are provided on the eleventh optical waveguide WG4d provided between the fifth optical splitter S5 and the fourth antenna AT4. The fourth single mode filter F4 is located between the fifth phase shifter PS5 and the fourth antenna AT4.

The sixth optical waveguide WG3c is diverged to the twelfth optical waveguide WG4e and the thirteenth optical waveguide WG4f from the sixth optical splitter S6. The twelfth optical waveguide WG4e and the thirteenth optical waveguide WG4f are parallel to each other and separated from each other. The length of the twelfth optical waveguide WG4e is the same as that of the thirteenth optical waveguide WG4f. The length of the twelfth optical waveguide WG4e may be the same as that of the eleventh optical waveguide WG4b. A fifth antenna AT5 is connected to an end of the twelfth optical waveguide WG4e and a sixth antenna AT6 is connected to an end of the thirteenth optical waveguide WG4f. The fifth single mode filter F5 is provided on the twelfth optical waveguide WG4e provided between the sixth optical splitter S6 and the fifth antenna AT5, where the sixth optical splitter S6 is located at the first distance from the fifth antenna AT5 and the sixth antenna AT6. A sixth phase shifter PS6 and a sixth single mode filter F6 are provided on the thirteenth optical waveguide WG4f provided between the sixth optical splitter S6 and the sixth antenna AT6. The sixth single mode filter F6 is located between the sixth phase shifter PS6 and the sixth antenna AT6.

The seventh optical waveguide WG3d is diverged to the fourteenth optical waveguide WG4g and fifteenth optical waveguide WG4h from the seventh optical splitter S7. The fourteenth optical waveguide WG4g and fifteenth optical waveguide WG4h are parallel to each other and separated from each other. The length of the fourteenth optical waveguide WG4g is the same as that of the fifteenth optical waveguide WG4h. The length of the fourteenth optical waveguide WG4g may be the same as that of the thirteenth optical waveguide WG4f.

A seventh antenna AT7 is connected to an end of the fourteenth optical waveguide WG4g, and an eighth antenna AT8 is connected to an end of the fifteenth optical waveguide WG4h. The seventh single mode filter F7 is provided on the fourteenth optical waveguide WG4g between the seventh optical splitter S7 and the seventh antenna AT7, where the seventh optical splitter S7 is located at the first distance from the seventh antenna AT7 and the eighth antenna AT8. A seventh phase shifter PS7 and an eighth single mode filter F8 are provided on the fifteenth optical waveguide WG4h provided between the seventh optical splitter S7 and the eighth antenna AT8. The eighth single mode filter F8 is located between the seventh phase shifter PS7 and the eighth antenna AT8. The first antenna AT1 through eighth antenna AT8 may form the antenna array 250.

In FIG. 3, the eighth optical waveguide WG4a through fifteenth optical waveguide WG4h to which the first antenna AT1 through eighth antenna AT8 are respectively connected are used as channels. The number of channels increases by n-th power ($2^n$) of two as the number n of stages at which the optical waveguide diverges increases. Here, n is 1, 2, 3 . . . . An optical splitter is arranged at a stage where the optical waveguide is diverged. In the case of FIG. 3, the number n of stages at which the optical waveguide diverges is three. Accordingly, the number of channels is eight ($2^3$). The number of stages may be increased to three or more. The first optical splitter S1 is disposed at the first stage at which the first optical waveguide WG1 is firstly divided into two stages, two optical splitters S2 and S3 are disposed at the second stage, and four optical splitters S4 through S7 are disposed at the third stage. In FIG. 3, the number of optical splitters at each stage where the optical waveguide is diverged is 2 (n-1) powers ($2^{(n-1)}$) of 2, and the total number of optical splitters disposed from the first stage to the nth stage is ($2^n$)-1. The number of phase shifters provided in each stage and the total number of phase shifters provided from the first stage to the nth stage may be equal to the number of optical splitters.

In FIG. 3, first light receiving element 210 and the second light receiving element 220 are connected to each of the first optical splitter S1 through the seventh optical splitter S7. The first light receiving element 210 and the second light receiving element 220 may be examples of photoelectric conversion elements. The first light receiving element 210 and the second light receiving element 220 may be, for example, photodiodes or may include photodiodes. In FIG. 3, the first light receiving element 210 and the second light receiving element 220 are disposed on a left side of each of the optical splitters S1 through S7. Accordingly, the two light receiving elements and one optical waveguide exit on one side of both sides, through which light may enter and exit, of each of the optical splitters, for example, the fourth optical splitter S4, and the diverged optical waveguides WG4a and WG4b exit on the other side of the fourth optical splitter S4. When the connection of the two light receiving elements to each optical splitter regarded as two branch lines are connected to each optical splitter, each optical splitter of FIG. 3 may have a form in which three branch lines are connected on a left side and two branch lines are connected on a right side of each of the optical splitters. This form may be a 3×2 optical splitter. If one branch line is connected to the left side of the optical splitter and two branch lines are connected to the right side, the optical splitter may be a 1×2 optical splitter. Of the three branch lines connected to the left side of the fourth optical splitter S4 having a 3×2 optical splitter form, the optical waveguide WG3a is a main path through which light is transmitted, and the two light receiving elements, that is, the first light receiving element 210 and the second light receiving element 220, are side paths. The same is true for other optical splitters having the 3×2 optical splitter form.

In the process of correcting a phase error, when phases of light transmitted through the eighth optical waveguide WG4a and the ninth optical waveguide WG4b, which are the first channel and the second channel, respectively, are different from each other, the phase of light transmitted through the ninth optical waveguide WG4b may be controlled by controlling the refractive index of the ninth optical waveguide WG4b in a region where the fourth phase shifter PS4 is provided by using the fourth phase shifter PS4. As a result, the phases of light transmitted from the first antenna AT1 and the second antenna AT2 to the fourth optical splitter S4 through the eighth optical waveguide WG4a and the ninth optical waveguide WG4b may be the same. The degree of controlling of the refractive index of the ninth optical waveguide WG4b of the region by using the fourth phase shifter PS4 may be determined by an electrical signal ES3 supplied to the fourth phase shifter PS4 from the phase tuner 120 of FIG. 1.

When the eighth optical waveguide WG4a and the ninth optical waveguide WG4b have phase errors generated during manufacturing an OPA, for example, in the case that widths of the eighth optical waveguide WG4a and the ninth optical waveguide WG4b are not equal to each other, in order to perform a correction with respect to the phase error, when light incident on the first antenna AT1 and the second antenna AT2 is transmitted to the fourth optical splitter S4 through the eighth optical waveguide WG4a and ninth optical waveguide WG4b, there is a phase difference between the light transmitted to the fourth optical splitter S4. Due to the phase difference, there are optical signals output from the fourth optical splitter S4 to the first light receiving element 210 and the second light receiving element 220, which are side paths. Since the intensity of the optical signal output to the first light receiving element 210 and the second light receiving element 220 varies according to the phase difference, the optical signal eventually contains information about a phase difference between two light transmitted through the eighth optical waveguide WG4a and the ninth optical waveguide WG4b. By a photoelectric conversion, an electrical signal corresponding to the optical signal is output from the first light receiving element 210 and the second light receiving element 220. The signal processor 110 of FIG. 1 measures the electrical signal ES1 output from the first light receiving element 210 and the second light receiving element 220. The measurement is included in the second operation S22 of FIG. 2.

Figure 4:
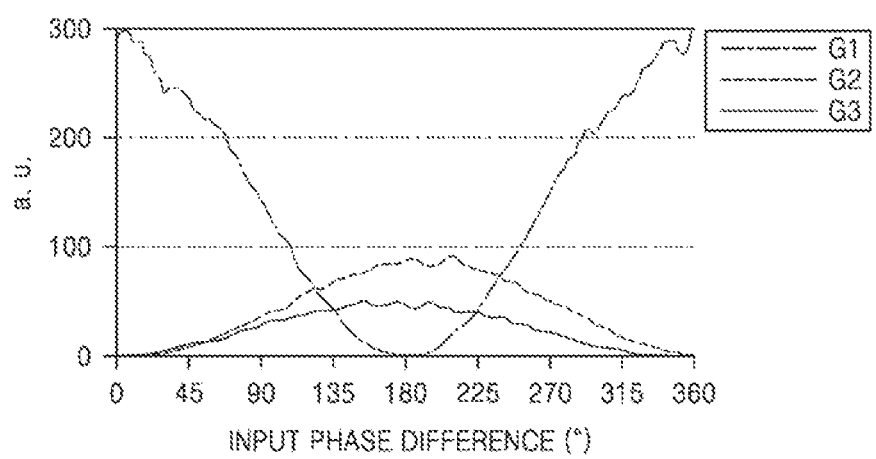
FIG. 4 is a graph showing the change of the intensity of an optical signal output to a main path and the intensity of an optical signal output to a side path of an optical splitter according to a phase difference between light transmitted through two input channels in a 3×2 optical splitter of an OPA including a member for correcting a phase error generated during a manufacturing process according to an example embodiment.

FIG. 4 is a graph showing the change of the intensity of an optical signal output to a main path of the optical splitter and the intensity of an optical signal output to a side path according to a phase difference between light transmitted through two input channels. The horizontal axis represents phase difference and the vertical axis represents the intensity of an optical signal output through each path. The first graph G1 represents the intensity of an optical signal output through the main path. The second graph G2 represents the intensity of an optical signal output through a first side path. The third graph G3 represents the intensity of an optical signal output through a second side path. The two input channels may be two optical waveguides connected to the right side of the optical splitter of FIG. 3. For example, the two input channels may be eighth optical waveguide WG4a and ninth optical waveguide WG4b connected to the fourth optical splitter S4. The main path may be a fourth optical waveguide WG3a connected to the left side of the fourth optical splitter S4, and the first side path and the second side path may be the first light receiving element 210 and the second light receiving element 220, respectively, connected to the fourth optical splitter S4.

Referring to FIG. 4, when a phase difference between light transmitted through the two input channels is 0°, constructive interference occurs between the light transmitted through the two input channels. As a result, it may be seen that an optical signal output from the fourth optical splitter S4 to the third optical waveguide WG3a, which is the main path, is maximized and an optical signal transmitted to the first light receiving element 210 and the second light receiving element 220, which are side paths, is minimized. On the contrary, when a phase difference between light transmitted through the two input channels is 180°, destructive interference occurs between the light transmitted through the two input channels. Accordingly, it may be seen that the optical signals transmitted to the first light receiving element 210 and the second light receiving element 220 respectively are maximized and the optical signals output to the third optical waveguide WG3a as the main path are minimized. When destructive interference occurs between the light transmitted through the two input channels, the optical signal that is not output to the main path may be scattered and spread, and the spread optical signals are collected to the first and second side paths and output. When a phase difference between the light transmitted through the two input channels is changed from 0° to 180°, the intensity of the optical signal output to the third optical waveguide WG3a is reduced but the intensity of the optical signals transmitted to the first light receiving element 210 and the second light receiving element 220 is increased. In addition, when a phase difference between the light transmitted through the two input channels is changed from 180° to 360°, the intensity of the optical signal output to the third optical waveguide WG3a is increased and the intensity of the optical signal transmitted to the first light receiving element 210 and the second light receiving element 220 is decreased.

The response characteristic of FIG. 4 may be used to determine a phase difference between light transmitted through the two input channels and to determine an electric signal value (e.g., a voltage value or a current value) to be input to a phase shifter in order to remove the phase difference.

For example, when the two input channels are the eighth optical waveguide WG4a and the ninth optical waveguide WG4b, in a process of correcting the phase difference, light injected through the first antenna AT1 is transmitted to the fourth optical splitter S4 through the eighth optical waveguide WG4a and light injected through the second antenna AT2 is transmitted to the fourth optical splitter S4 through the ninth optical waveguide WG4b.

Referring to FIG. 4, the phase difference between the light transmitted through the eighth optical waveguide WG4a and the ninth optical waveguide WG4b may be seen from the intensity of an optical signal received by the first light receiving element 210 and the second light receiving element 220, which are side paths, connected to the fourth optical splitter S4, and the intensity of the optical signal received by the first light receiving element 210 and the second light receiving element 220 may be found by measuring an electrical signal output from the first light receiving element 210 and the second light receiving element 220, which are photoelectric conversion elements. The phase difference may be removed by applying a phase change to the ninth optical waveguide WG4b by using the fourth phase shifter PS4 provided on the ninth optical waveguide WG4b. For example, the phase change of the ninth optical waveguide WG4b is controlled by using the fourth phase shifter PS4 until the intensity of the optical signal received by the first light receiving element 210 and the second light receiving element 220 is minimum. The phase of light transmitted through the ninth optical waveguide WG4b is changed by controlling the phase change of the ninth optical waveguide WG4b. Therefore, the control of the phase change of the ninth optical waveguide WG4b may eventually denote the control of refractive index of a portion of the ninth optical waveguide WG4b where the fourth phase shifter PS4 is provided. Therefore, the phase change of the ninth optical waveguide WG4b may be controlled according to an electric signal value applied to the fourth phase shifter PS4. When a first electrical signal value is applied to the fourth phase shifter PS4, if the intensity of an optical signal received by the first light receiving element 210 and the second light receiving element 220 is minimum, the phase difference between the light passing through the eighth optical waveguide WG4a and the ninth optical waveguide WG4b disappears when the first electrical signal value is applied to the fourth phase shifter PS4. That is, the phases of light passing through the eighth optical waveguide WG4a and the ninth optical waveguide WG4b are the same. In other words, phase errors generated during the manufacturing process of the eighth optical waveguide WG4a and the ninth optical waveguide WG4b may be corrected by controlling a value input to the fourth phase shifter PS4 to a first electric signal value.

The process of identifying the phase difference between the light passing through the eighth optical waveguide WG4a and the ninth optical waveguide WG4b and finding an electrical signal value applied to the fourth phase shifter PS4 to remove the phase difference described with reference to FIG. 4 may also be applied to the remaining optical waveguides of the first OPA 200 shown in FIG. 3. Through this application, an electric signal value to be applied to the fifth phase shifter PS5 to remove a phase error of the tenth optical waveguide WG4c and eleventh optical waveguide WG4d, an electric signal value to be applied to the sixth phase shifter PS6 to remove a phase error of the twelfth optical waveguide WG4e and the thirteenth optical waveguide WG4f, and an electrical signal value to be applied to the seventh phase shifter PS7 in order to remove a phase error of the fourteenth optical waveguide WG4g and the fifteenth optical waveguide WG4h may be known. In addition, an electrical signal value to be applied to the second phase shifter PS2 to remove a phase error of the fourth optical waveguides WG3a and the fifth optical waveguide WG3b and an electrical signal value to be applied to the third phase shifter PS3 to remove a phase error of the sixth optical waveguide WG3c and the seventh optical waveguide WG3d may be known. In addition, an electrical signal value to be applied to the first phase shifter PS1 to remove a phase error of the second optical waveguides WG2a and the third optical waveguide WG2b may be known.

The phase differences resulting from the manufacturing processes for all optical paths in the first OPA 200 of FIG. 3 may be removed by controlling the input values of the first phase shifter PS1 through the seventh phase shifter PS7 to electrical signal values in the first OPA 200. That is, a phase error of the first OPA 200 generated during a manufacturing process may be completely corrected. Accordingly, in a normal operation of the first OPA 200, a phase of each channel may be controlled as desired in a process in which light radiated to a light source is transmitted to the antenna array 250 through channels and is emitted. Accordingly, a more accurate and reliable beam steering may be formed.

The process of correcting the phase error of the first OPA 200 described above includes a process of minimizing the intensity of an optical signal output to the first light receiving element 210 and the second light receiving element 220, which are side paths. The process of minimizing the intensity of an optical signal output to the first light receiving element 210 and the second light receiving element 220 is a process of removing a phase difference of a related channel by using a phase shifter, and the value of the electrical signal that is applied to the phase shifter according to the magnitude of the phase difference is also varied. The process of correcting a phase error is performed with respect to several channels. Therefore, the process of correcting a phase error is a process of removing a phase difference of various sizes, and is a process of applying an electric signal value of various sizes to a phase shifter to remove the phase difference of the various sizes. This process is repeatedly performed until a phase error is corrected. Therefore, when a process of correcting a phase error is completed, data about an electric signal value applied to a phase shifter may be accumulated to remove phase differences of various magnitudes generated in a channel. The data obtained in this way may determine the degree of providing an electrical signal to the phase shifter in order to control the phase of a channel to a given value. That is, when controlling the phase of each channel in the course of normally operating an OPA according to an original purpose based on the data obtained in the process of correcting the phase error of the OPA, that is, when controlling the phase of light transmitted through each channel, the amount of the electrical signal to be input to the phase shifter for phase control may be determined. Since a beam steering of the OPA is a result of phase control of light transmitted through a plurality of channels, data obtained in the process of correcting a phase error of the OPA may be used for beam steering.

In a normal operation of the OPA, light injection to the light injection unit 260 may be performed by using, for example, a horizontal incidence method through an edge coupling through a side of a waveguide or a vertical incidence method through a grating coupler. In another example, the light injection may be performed by injecting light into the light injection unit 260 from a light source after directly providing the light source to an OPA chip.

Figure 5:
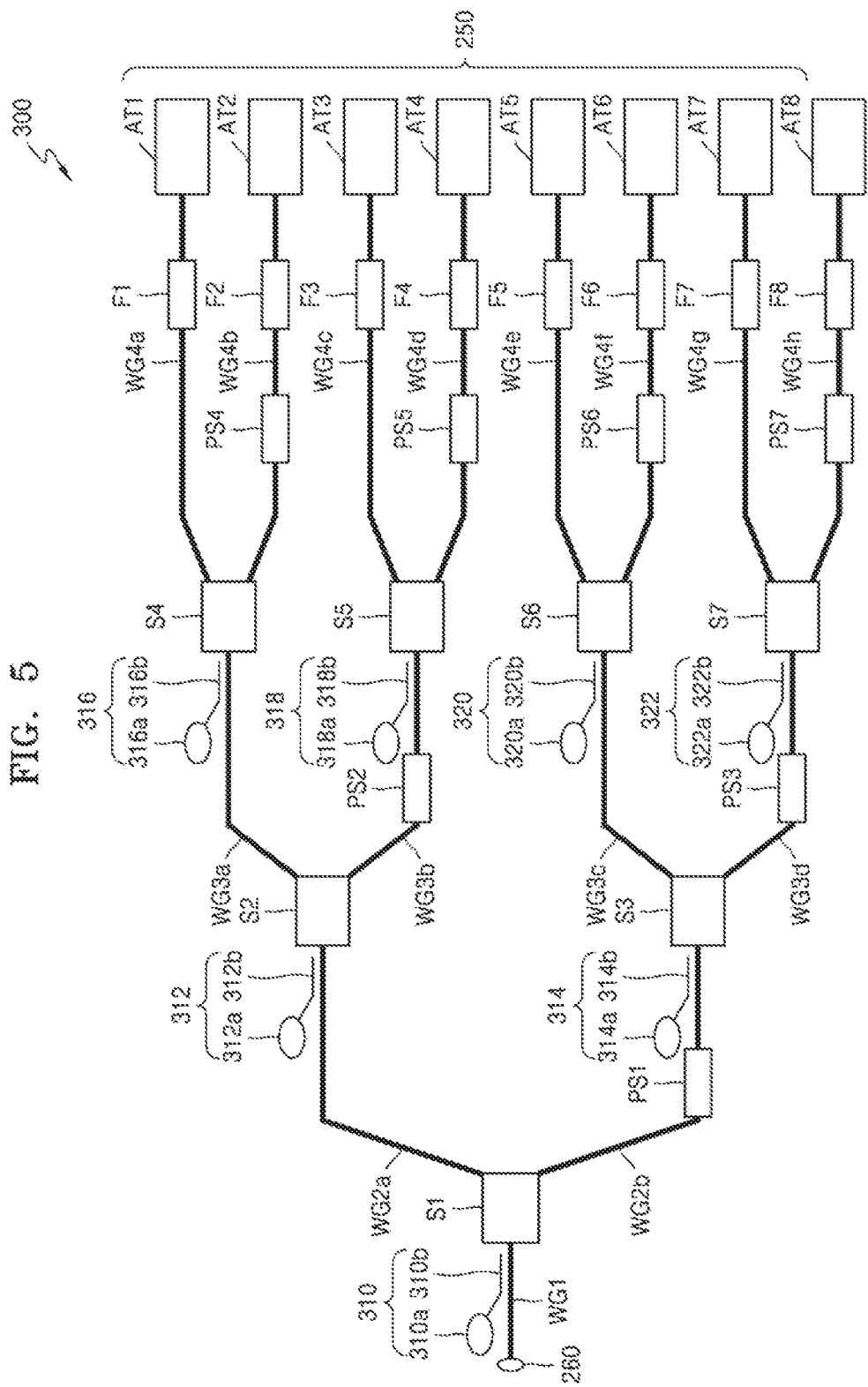
FIG. 5 is a plan view illustrating a second OPA including a member for correcting a phase error generated in a manufacturing process according to an example embodiment.

FIG. 5 shows a second OPA 300 including a member for correcting phase errors generated during a manufacturing process, according to another example embodiment. Only parts different from the first OPA 200 described with reference to FIG. 3 will be described. Like reference numerals are used to indicate elements that are substantially identical to the elements of FIG. 3. In the second OPA 300, light receiving elements such as the first light receiving element 210 and the second light receiving element 220 of FIG. 3 are not connected to the first optical splitter S1 through the seventh optical splitter S7. Only three optical waveguides are connected to each of the first optical splitter S1 through the seventh optical splitter S7. One optical waveguide is connected to a left side and two optical waveguides are connected to a right side of each of the optical splitters S1 through S7. Therefore, each of the optical splitters S1 through S7 in FIG. 5 is a 1×2 optical splitter. A first tap coupler 310 is provided close to a first optical waveguide WG1. The first tap coupler 310 may be disposed between a light injection unit 260 and the first optical splitter S1. The first tap coupler 310 includes a first light receiving element 310a and a first tap path 310b connected to the first light receiving element 310a. The first tap coupler 310 is an element tapping a portion of light transmitted through the adjacent optical waveguide WG1, that is, an element that extracts a portion of the light transmitted through the optical waveguide WG1 into the first tap path 310b. Therefore, the first tap path 310b may be disposed at a position configured to tap a portion of the light transmitted through the first optical waveguide WG1. For example, when light is transmitted as opposed to a normal operation, that is, when light is transmitted to the first optical waveguide WG1 through the first optical splitter S1, the first tap path 310b may be provided to tap a part of the light transmitted through the first optical waveguide WG1. The first light receiving element 310a may be, for example, a photodiode or include a photodiode. The first tap path 310b may be in contact with a side of the first optical waveguide WG1.

When the second OPA 300 is normally operated, an operation of a tap coupler adjacent to an optical waveguide may be stopped to reduce the loss of light transmitted through an optical waveguide. This may be applied to all tap couplers included in the second OPA 300.

A second tap coupler 312 is disposed adjacent to a second optical waveguide WG2a. The second tap coupler 312 is disposed closer to the second optical splitter S2 than the first optical splitter S1. The second tap coupler 312 includes a second light receiving element 312a and a second tap path 312b. The second light receiving element 312a may be, for example, a photodiode or include a photodiode. The second tap path 312b may be provided at a position configured to tap a portion of light transmitted through the second optical waveguide WG2a. For example, when a portion of light transmitted to the second optical waveguide WG2a and the first optical splitter S1 through the second optical splitter S2 is emitted to the outside of the second optical waveguide WG2a, the second tap path 312b may be provided at a position capable of receiving the emitted light. A third tap coupler 314 is provided close to a third optical waveguide WG2b. The third tap coupler 314 includes a third light receiving element 314a and a third tap path 314b. The third tap coupler 314 may be disposed between the first phase shifter PS1 and the third optical splitter S3. The third light receiving element 314a may be the same device as the first light receiving element 310a and the second light receiving element 312a, or may be another photoelectric conversion element. The third tap path 314b may be in contact with the third optical waveguide WG2b. The third tap path 314b may be an optical path provided to transmit light to the third light receiving element 314a. The third tap path 314b may be provided for tapping a portion of light transmitted from the third optical splitter S3 to the third optical waveguide WG2b. A fourth tap coupler 316 is disposed close to a fourth optical waveguide WG3a. The fourth tap coupler 316 includes a fourth light receiving element 316a and a fourth tap path 316b connected thereto. The fourth light receiving element 316a may be the same photoelectric conversion element as the third light receiving element 314a. The fourth tap coupler 316 is disposed closer to the fourth optical splitter S4 than the second optical splitter S2. The fourth tap path 316b may be in contact with the fourth optical waveguide WG3a. The fourth tap path 316b may be provided at a position configured to tap a portion of a light transmitted to the fourth optical waveguide WG3a through the fourth optical splitter S4.

A fifth tap coupler 318 is disposed adjacent to a fifth optical waveguide WG3b. The fifth tap coupler 318 is disposed between a second phase shifter PS2 and the fifth optical splitter S5. The fifth tap coupler 318 includes a fifth light receiving element 318a and a fifth tap path 318b connected thereto. The fifth light receiving element 318a may be a photoelectric conversion element. For example, the fifth light receiving element 318a may be a photodiode or include a photodiode. The fifth tap path 318b may be in contact with the fifth optical waveguide WG3b. The fifth tap path 318b may be provided at a position configured to tap light transmitted through the fifth optical waveguide WG3b through the fifth optical splitter S5.

A sixth tap coupler 320 is disposed adjacent to a sixth optical waveguide WG3c. The sixth tap coupler 320 may be located between the third optical splitter S3 and the sixth optical splitter S6. The sixth tap coupler 320 includes a sixth light receiving element 320a and a sixth tap path 320b. The sixth light receiving element 320a may be the same element as the fifth light receiving element 318a in a configuration and a role. One side of the sixth tap path 320b may be connected to the sixth light receiving element 320a, and the other side thereof may be close to or in contact with the sixth optical waveguide WG3c. In either cases, the sixth tap path 320b may be provided at a position configured to tap light transmitted through the sixth optical waveguide WG3c through the sixth optical splitter S6.

A seventh tap coupler 322 is positioned close to a seventh optical waveguide WG3d. The seventh tap coupler 322 is provided between the seventh optical splitter S7 and a third phase shifter PS3. The seventh tap coupler 322 may be provided at a position configured to tap light transmitted through the seventh optical waveguide WG3d through the seventh optical splitter S7. The seventh tap coupler 322 may include a seventh light receiving element 322a and a seventh tap path 322b. The seventh light receiving element 322a may be the same device as the sixth light receiving element 320a. The seventh light receiving element 322a is separated from the seventh optical waveguide WG3d. One side of the seventh tap path 322b is connected to the seventh light receiving element 322a, and the other side thereof may be close to or in contact with the seventh optical waveguide WG3d for tapping light. Tapping for light transmitted through the seventh optical waveguide WG3d through the seventh optical splitter S7 may be performed through the seventh tap path 322b.

The configurations of the first through seventh tap couplers 310, 312, 314, 316, 318, 320, and 322 described above may all be the same, but this is merely an example. In another example, some of the first through seventh tap couplers 310, 312, 314, 316, 318, 320, and 322, may be configured to be the same as the rest of the tap coupler in function, but may differ from the rest of the tap coupler in configuration.

Figure 6:
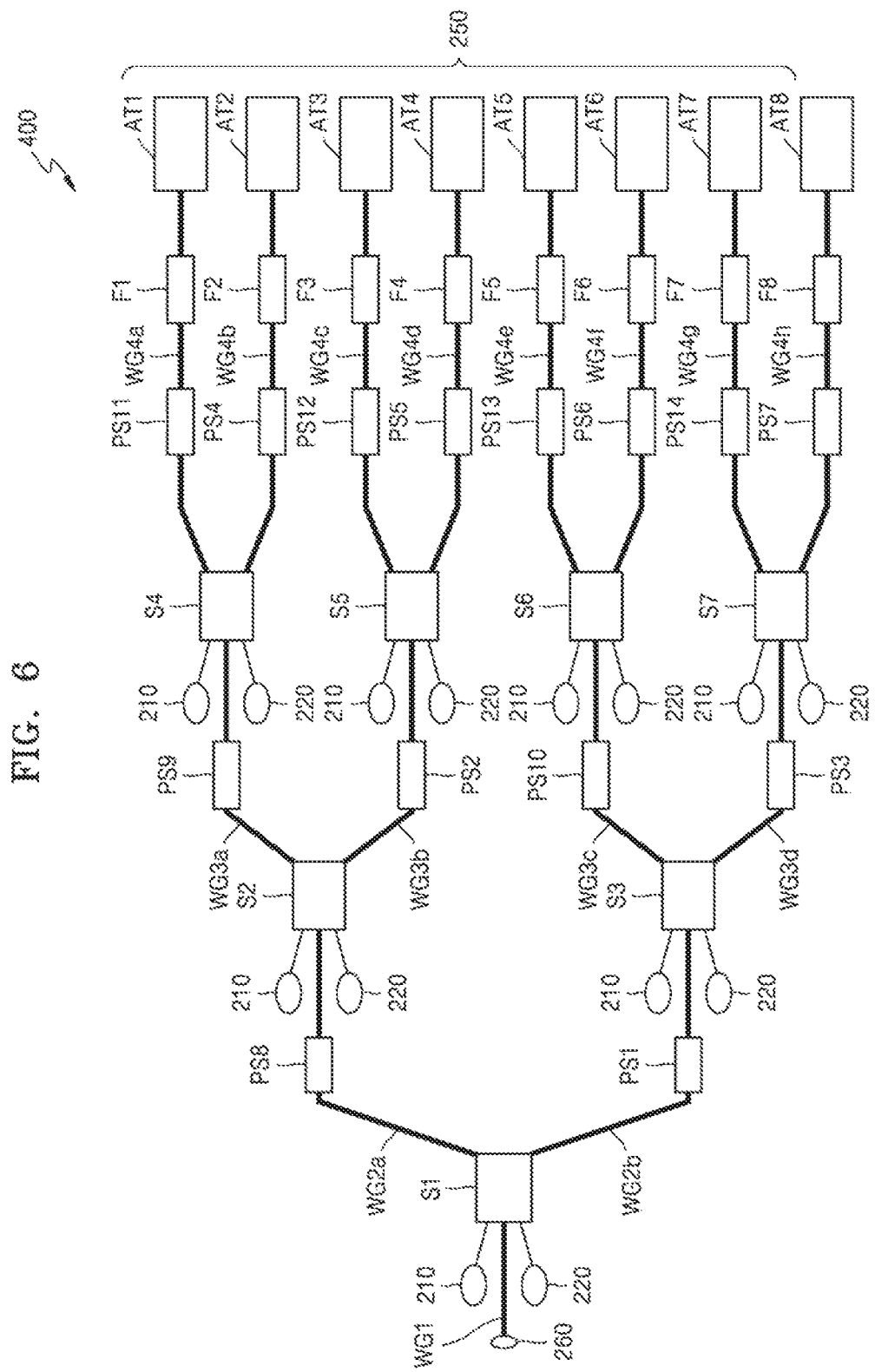
FIG. 6 is a plan view illustrating a third OPA including a member for correcting a phase error generated in a manufacturing process according to an example embodiment.

FIG. 6 shows a third OPA 400 including a member for correcting phase errors generated during a manufacturing process according to another example embodiment. The descriptions about the third OPA 400 of FIG. 6 are limited to parts different from the first OPA 200 of FIG. 3. Also, like reference numerals are used to indicate elements that are substantially identical to the elements of FIG. 3.

The third OPA 400 includes more phase shifters than the first OPA 200 of FIG. 3. For example, the third OPA 400 may include phase shifters greater than twice the number of phase shifters included in the first OPA 200 of FIG. 3.

Referring to FIG. 6, phase shifters are disposed in all optical waveguides WG2a, WG2b, WG3a through WG3d, and WG4a through WG4h provided between the first optical splitter S1 and the antenna array 250. That is, the third OPA 400 may include the first phase shifter PS1 through the seventh phase shifters PS7 of FIG. 3 together with the eighth phase shifter PS8 disposed on the second optical waveguide WG2a, the ninth phase shifter PS9 disposed on the fourth optical waveguide WG3a, the tenth phase shifter PS10 disposed on the sixth optical waveguide WG3c, the eleventh phase shifter PS11 disposed on the eighth optical waveguide WG4a which is a first channel, the twelfth phase shifter PS12 disposed on the tenth optical waveguide WG4c which is a third channel, the thirteenth phase shifter PS13 disposed on the twelfth optical waveguide WG4e which is a fifth channel, and the fourteenth phase shifter PS14 disposed on the fourteenth optical waveguide WG4g which is a seventh channel.

In the case of two phase shifters arranged at equal location, equivalent optical waveguides, each phase shifter is responsible for a phase shift of 0 through π. For example, the second optical waveguide WG2a and the third optical waveguide WG2b may be equivalent optical waveguides, and the fourth optical waveguide WG3a and the fifth optical waveguide WG3b may also be equivalent optical waveguides. The equivalent optical waveguide may refer to two optical waveguides which are directly branched from the same optical splitter. Accordingly, the first phase shifter PS1 and the eighth phase shifter PS8 may be two phase shifters disposed at the equal location, and each of the first phase shifter PS1 and the eighth phase shifter PS8 respectively are responsible for a phase shift of 0 through π. As in the case of the first OPA 200 of FIG. 3, when the second phase shifter PS2 is provided only on the fifth optical waveguide WG3b among the fourth optical waveguide WG3a and the fifth optical waveguide WG3b, the second phase shifter PS2 is responsible for a phase shift of 0 through 2π.

Figure 7:
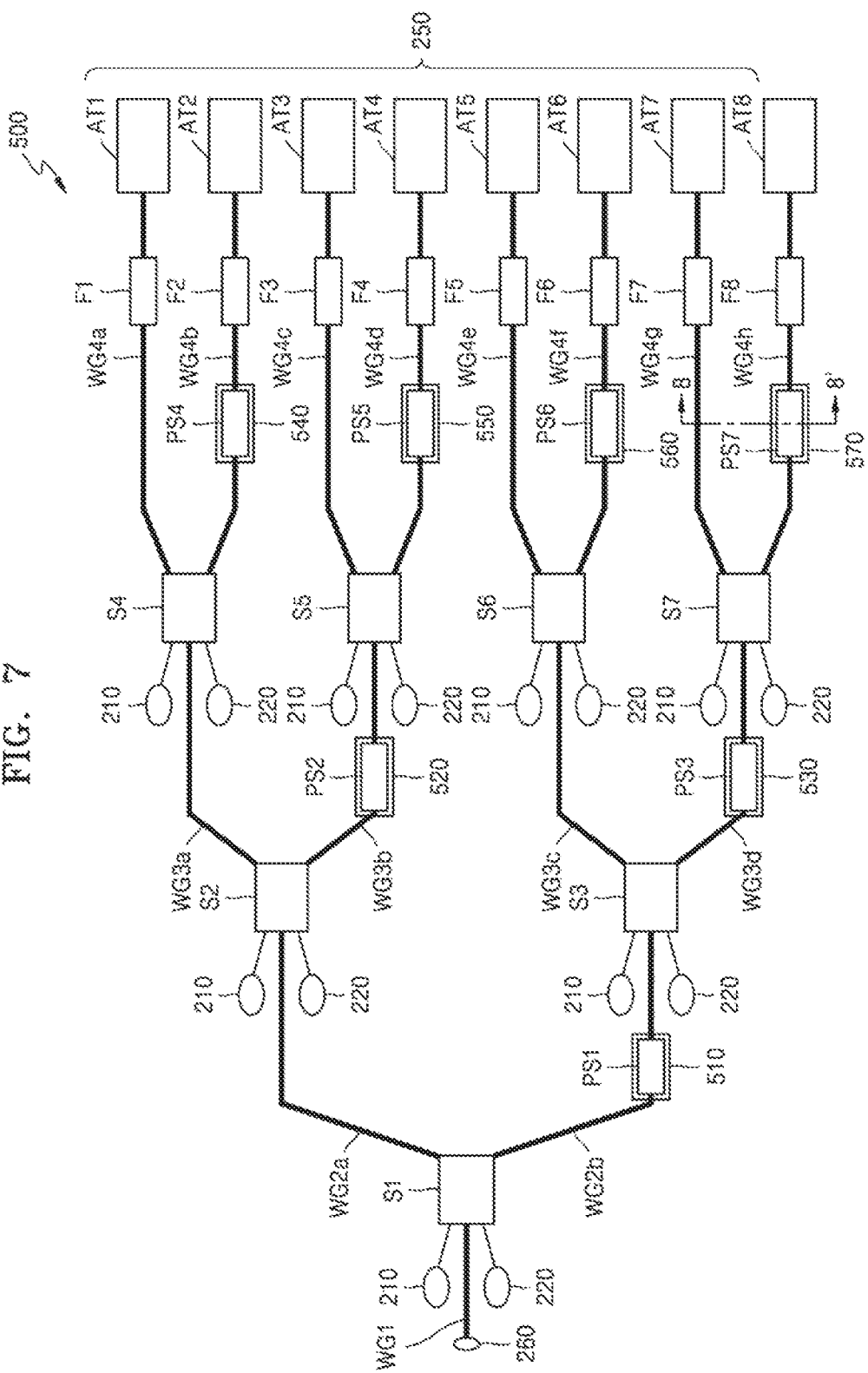
FIG. 7 is a plan view illustrating a fourth OPA including a member for correcting a phase error generated in a manufacturing process according to an example embodiment.

FIG. 7 shows a fourth OPA 500 including a member for correcting phase errors generated in a manufacturing process, according to another example embodiment. The descriptions about the fourth OPA 500 of FIG. 7 are limited to parts different from the first OPA 200 of FIG. 3. Also, like reference numerals are used to indicate elements that are substantially identical to the elements of FIG. 3.

Referring to FIG. 7, in the fourth OPA 500, heat shielding elements 510, 520, 530, 540, 550, 560, and 570 respectively are disposed around first phase shifter PS1 through seventh phase shifter PS7. In a plan view, each of the heat shielding elements 510, 520, 530, 540, 550, 560, and 570 may surround an entire corresponding phase shifter. Each of the heat shielding elements 510, 520, 530, 540, 550, 560, and 570 is provided to prevent or reduce heat generated from an operation of a corresponding phase shifter from being transferred to adjacent optical waveguides (channels) or to minimize heat transfer. Since the heat shielding elements are provided, the effect of heat generated in a process of correcting a phase with respect to a particular channel to the phase correction of an adjacent channel may be prevented or reduced. The heat shielding elements may also be provided in the third OPA 400 of FIG. 6.

Figure 8:
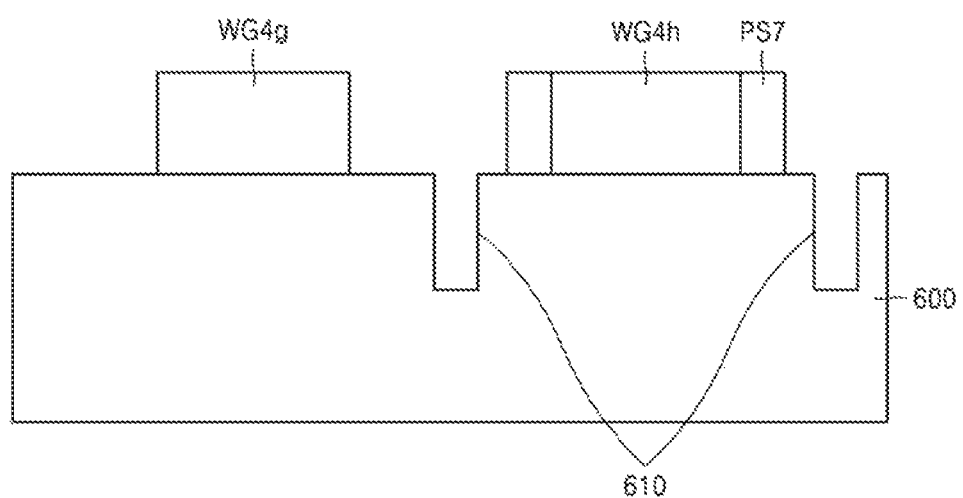
FIG. 8 is a cross-sectional view taken along the line 8-8' of FIG. 7.

FIG. 8 shows an example of a heat shielding element and shows a cross section taken along the line 8-8' in FIG. 7.

Referring to FIG. 8, a fourteenth optical waveguide WG4g and a fifteenth optical waveguide WG4h are separated from each other on a substrate 600. The substrate 600 may include a silicon substrate, but may include various substrates. For example, gallium arsenide (GaAs), indium phosphorus (InP), $SiO_2$, etc. may be used as the substrate 600. A material of the fourteenth optical waveguide WG4g and the fifteenth optical waveguide WG4h may include silicon. Although it is depicted that the seventh phase shifter PS7 is disposed on a side of the fifteenth optical waveguide WG4h, embodiments are not limited thereto. For example, a portion of the fifteenth optical waveguide WG4h that contacts the seventh phase shifter PS7 may also be a member of the seventh phase shifter PS7. A trench 610 is formed in the substrate 600 between the fourteenth optical waveguide WG4g and the fifteenth optical waveguide WG4h. The trench 610 is formed closer to the fifteenth optical waveguide WG4h than the fourteenth optical waveguide WG4g. The trench 610 is provided at both sides of the fifteenth optical waveguide WG4h. Since the trench 610 is formed around the fifteenth optical waveguide WG4h, heat generated while the seventh phase shifter PS7 is operated to control a phase of light transmitted through the fifteenth optical waveguide WG4h may be blocked from being transferred to the fourteenth optical waveguide WG4g. The trench 610 may not be filled, or may be filled with an insulating material having a low thermal conductivity, for example, $SiO_2$.

Figure 9:
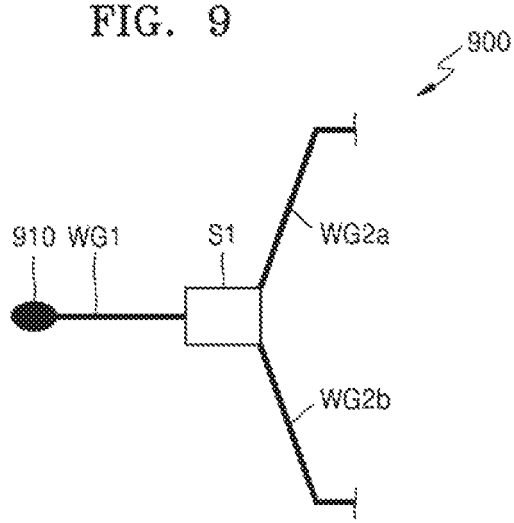
FIG. 9 is a plan view illustrating a fifth OPA including a member for correcting a phase error generated in a manufacturing process according to an example embodiment.

FIG. 9 shows a fifth OPA 900 including a member for correcting a phase error. In the fifth OPA 900, a right part of a first optical splitter S1 is the same as any of the first through fourth OPAs 200, 300, 400, and 500 described above, and thus, the description thereof is omitted. If the first through fourth OPAs 200, 300, 400, and 500 are OPAs that combine a light emission mode, a normal operation mode of an OPA in which a phase correction is completed, and a light receiving mode, a phase correction mode, the fifth OPA 900 is an OPA operating only in the light receiving mode. The fifth OPA 900 does not have a light injection unit. The fifth OPA 900 includes an optical receiver 910 in place of the light injection unit 260 of the first through fourth OPAs 200, 300, 400, and 500. The first optical splitter S1 is a 1×2 optical splitter and does not include the first light receiving element 210 and the second light receiving element 220 connected to the first optical splitter S1 of the first through fourth OPAs 200, 300, 400, and 500. The fifth OPA 900 operates in a light receiving mode, but the correction of the phase difference of the optical waveguide between the first optical splitter S1 and the antenna array 250 may be performed in the same manner as described in the first through fourth OPAs 200, 300, 400, and 500. The optical receiver 910 may be a photodetector. The optical receiver 910 may be a light receiving element or a light receiver including the light receiving element. The light receiving element may be, for example, a photodiode. The optical receiver 910 may measure an amount of light incident through the antenna array 250.

Figure 10:
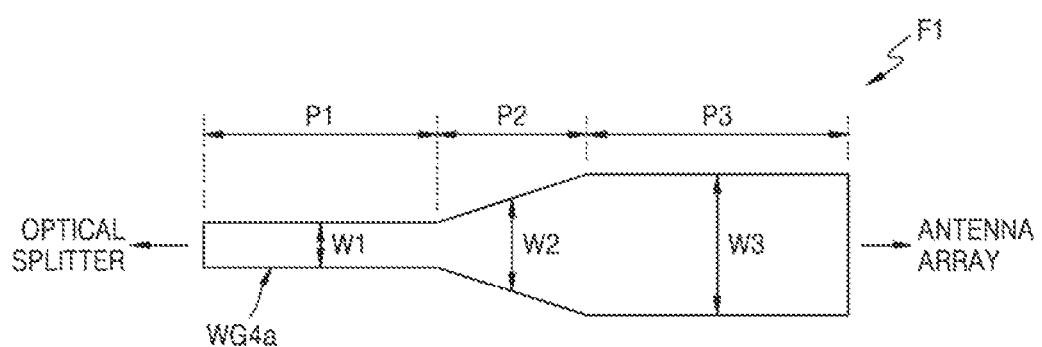
FIG. 10 is a plan view illustrating an example of a single mode filter included in an OPA including a member for correcting a phase error generated in a manufacturing process according to an example embodiment.

FIG. 10 shows an example of any one of the single mode filters F1 through F8 included in the first through fourth OPAs 200, 300, 400, and 500 described above. For example, the single mode filter depicted in FIG. 10 may be the first single mode filter F1. The description about the single mode filter depicted in FIG. 10 may be applied to other single mode filters. The first single mode filter F1 depicted in FIG. 10 is not provided separately from a channel but is formed by modifying some sections of an optical waveguide.

Referring to FIG. 10, the first single mode filter F1 is formed by modifying some sections of the eighth optical waveguide WG4a such that the corresponding sections have a single mode filter function.

In detail, the first single mode filter F1 may include a first section P1, a second section P2, and a third section P3. The first section P1 is connected to the fourth optical splitter S4, and the third section P3 is connected to the first antenna AT1. A width W1 of the first section P1 is the least among the first through third sections P1 through P3, and a width W3 of the third section P3 is the greatest. The width W1 of the first section P1 may be a width through which only a basic mode (single mode) of light may be transmitted. For example, the width W1 of the first section P1 may be from about 0.2 μm to about 1 μm. However, the size of the width W1 is not limited thereto. The width W3 of the third section P3 may be, for example, about 0.5 μm to 10 μm, but is not limited thereto. The second section P2 is between the first section P1 and the third section P3, and a width W2 is changed in a length direction. The width W2 of the second section P2 increases from the first section P1 towards the third section P3. When light is incident through an antenna to correct a phase error of an OPA, the light transmitted from the first antenna AT1 to the third section P3 may include both a basic mode and several higher-order modes. That is, in the third section P3, light in which light of secondary and tertiary modes are mixed together with the basic mode may be transmitted from the first antenna AT1. Accordingly, the third section P3 may be a multi-mode section. Light transmitted to the third section P3 passes through the second section P2 where the width W2 gradually reduces, and, at this point, light of several higher-order modes except the basic mode are sequentially scattered to exit the optical waveguide WG4a, and only the basic mode light is transmitted to the first section P1. Therefore, the first section P1 may be a single mode section. Also, since light is converted from a multimode to a single mode while passing through the second section P2, the second section P2 may be a conversion section. As a result of the action of the single mode filter, only single mode light may be transmitted to an optical splitter side.

When considering the configuration of the first single mode filter F1 and when the OPA is normally operating in the light emitting mode, the effect of the first single mode filter F1 should be considered. However, when a length of the second section P2 is sufficiently long, the single mode light transmitted to the first single mode filter F1 through the fourth optical splitter S4 may maintain the single mode even though the light passes through the second section P2. As a result, when an OPA is normally operated and when the length of the second section P2 is sufficiently long, the single mode light transmitted to the first single mode filter F1 through the fourth optical splitter S4 may maintain the single mode even after passing through the first single mode filter F1. Therefore, when the OPA is normally operated, the light passing through the first single mode filter F1 may be transmitted to the first antenna AT1 while maintaining the single mode. The length of the second section P2 from which these results may be obtained may be, for example, about 10 μm to 100 μm, but is not limited thereto.

The evaluation of an OPA phase correction method may be based on the number of phase shifter input combinations that should be evaluated to achieve a particular side mode suppression ratio (SMSR). In other words, the OPA phase correction method may be evaluated by the number of times the process (evaluation process) of inputting an electrical signal to the phase shifters included in the OPA needs to be repeated until a desired result (e.g., beam forming) is obtained. When a first correction method is used instead of a second correction method for the evaluation process, if the number of repetitions of the first correction method is less than that of the second correction method, the first correction method may be evaluated to be relatively superior to the second correction method.

When using the OPA according to an example embodiment described above, for example, the first OPA 200 of FIG. 3, the number of times the evaluation process is repeated to obtain a desired beam forming will be described.

The number of channels of the first OPA 200 of FIG. 3 is eight (WG4a through WG4h), but, for the evaluation, the number of channels of the first OPA 200 is considered to be 32. In order for the number of channels to be 32 in the first OPA 200, two stages should be further extended to the right in addition to the three stages as illustrated in FIG. 3. That is, the number n of stages is five, and the number of channels is 32 by the fifth power of 2 ($2^5$). In the case of the first OPA 200, two optical waveguides are diverged from each of the optical splitters S1 through S7 at each stage, and a phase shifter is disposed at half of the diverged optical waveguides. Therefore, when 32 channels are provided in the first OPA 200, the total number of phase shifters included in the first OPA 200 is 31 (16+8+4+2+1). When the number of phase shifters is considered, scanning with a phase shifter, that is, performing a phase control over an entire period ($2\pi$) is practically difficult, and thus, it is assumed that the phase scan by using the phase shifter is performed under the following conditions.

In detail, the scan is performed in each phase shifter at intervals of $\pi/4$ by dividing a phase of one period ($2\pi$) into eight steps. In a scan that is considered to correct a phase in the eight steps of the scan, an additional scan is performed with respect to four values around electric signal values applied to the phase shifter for the corresponding scan. This is to increase accuracy. For example, assuming that a corrected result is obtained in the case of a phase scan of $\pi/2$, which is a two-stage scan, that is, when a phase of light transmitted through the corresponding channel is controlled by as much as π/2 by using a phase shifter, it may be assumed that the change of the corrected result is observed by controlling the phase of transmitted light to four values slightly larger or less than π/2.

Under these conditions, when the evaluation process is performed to obtain a desired correction result, for example, beam forming, by using the 31 phase shifters, the evaluation process is repeated a total of 372 times, which is the number of phase shifters: 31× (the number of scan steps of each phase shifter for one period: 8+the number of additional scans performed in a specific scan step: 4). That is, when the first OPA 200 of FIG. 3 is used, a desired beam forming may be obtained after 372 evaluation processes.

With respect to an OPA having 32 channels of the related art, when a correction algorithm, algorithm for controlling an input value of a phase shifter, such as a PSO is used, the number of evaluations performed until a desired correction result, for example, beam forming, is obtained is 207,600 times, when a calibration algorithm referred to as a SPGD is used, the number of evaluations performed is 80,001 times, and when a calibration algorithm referred to as a DSGD, the number of evaluations performed is 7,048 times. The number of evaluations is about 15 times as much as when using the first OPA 200 of FIG. 3 which is 372 times, and as much as about 500 times more. This suggests that when the phase correction is performed by using the OPA according to the example embodiments described above, the phase correction may be about 15 to 500 times faster. Also, in the case of the first OPA 200 of FIG. 3, an electric signal output from a photodetector, that is, a photocurrent value is measured in the evaluation process, but the phase correction evaluation by using the OPA of the related art is a process of confirming whether phase correction is needed by taking an image with a camera. Therefore, when the phase correction is performed by using the OPA according to the example embodiments described above, the correction cost and time may be reduced compared to that of the related art.

The phase error correction method using the OPA according to the example embodiments described above is not limited to correcting the phase error generated during a manufacturing process of the OPA. The OPA correction method according to the example embodiments described above may be used as a correction method with respect to all phase errors occurred between channels included in the OPA regardless of the cause of the occurrence.

In addition, the OPA and the phase correction method using the same may be extended to a general phased array and a phase correction method. That is, the configuration of the first through fifth OPAs 200, 300, 400, 500, and 900 may be applied to a general phase array using electromagnetic waves having a wavelength outside the infrared band. The optical splitter described in the first through fifth OPAs 200, 300, 400, 500, and 900 may be a splitter, and the optical waveguide may be a waveguide, and the light injection unit may be an electromagnetic wave injection unit.

A phase correction method having a concept completely different from that of an OPA phase correction method of the related art is used. That is, light for phase correction is injected to the OPA antenna array to advance the light in a reverse direction of the light travels when the OPA is normally operating. In addition to the main optical waveguide, a light receiving element as a concept of a side path is connected to an optical splitter included in the OPA. When there is a phase difference between light transmitted in the reverse direction through a channel, an optical signal corresponding to the phase difference is received by the light receiving element connected to the optical splitter. The received optical signal is converted into an electrical signal by photoelectric conversion, and finally an electric signal value for correcting the phase difference is generated through a signal processor and a phase tuning tuner, and thus, a phase correction is achieved by applying the electric signal value to a phase shifter. The series of processes may include injecting light in an opposite direction to the OPA, measuring of an optical signal having information about a phase difference of a channel, and performing a phase correction based on the optical signal. The correction method is simpler than the phase correction process of the related art in which an image taken by using a camera is compared and analyzed, and may reduce time and cost since an optical signal generated corresponding to a phase difference is more simply measured instead of taking an image.

In addition, since a phase of the channel may be more finely controlled by using a phase shifter, the intensity of a measured optical signal may also be more finely controlled, and as a result, a fine phase correction is possible and a further a more accurate and reliable phase correction may be realized. Through this process, it is possible to obtain data of an electric signal value to be applied to a phase shifter for phase control of each channel, and the obtained data may be used to phase control each channel for emitting a beam in a desired direction when an OPA with a completed phase correction is normally operated.

An OPA according to the example embodiments described above may be used to correct a phase error occurred in the OPA for various reasons besides a correction with respect to a phase error generated during a manufacturing process.

It should be understood that embodiments described herein should be considered in a descriptive sense only and not for purposes of limitation. Descriptions of features or aspects within each example embodiment should typically be considered as available for other similar features or aspects in other example embodiments.

While example embodiments have been described with reference to the figures, it will be understood by those of ordinary skill in the art that various changes in form and details may be made therein without departing from the spirit and scope as defined by the following claims.

What is claimed is:

1. An optical phased array comprising:
    a light injector;
    a first splitter connected to the light injector;
    a first phase shifter connected to the first splitter;
    a plurality of waveguides connected to the first splitter, portions of the plurality of waveguides being connected to the first splitter via the first phase shifter;
    an antenna array connected to the plurality of waveguides;
    a single mode filter provided in each of the plurality of waveguides; and
    a first photodetector connected to the first splitter and configured to detect a portion of light radiated onto the antenna array.

2. The optical phased array of claim 1, wherein one waveguide and the first photodetector are connected to a first side of the first splitter through which light enters and exits,
    wherein two waveguides are connected to a second side of the first splitter and diverge from the first splitter, and
    wherein the first phase shifter is provided on one of the two waveguides.

3. The optical phased array of claim 2, wherein the first photodetector comprises a first light receiving element and a second light receiving element respectively provided on opposite sides of the one waveguide.

4. The optical phased array of claim 1, wherein the single mode filter is integrated into the each of the plurality of waveguides.

5. The optical phased array of claim 4, wherein the single mode filter comprises:
a first section having a first width;
a second section having a second width; and
a third section having a third width,
wherein the first width, the second width, and the third width are different from each other.

6. The optical phased array of claim 1, further comprising:
a plurality of splitters provided between the first splitter and the plurality of waveguides; and
a plurality of photodetectors connected to the plurality of splitters.

7. The optical phased array of claim 6, wherein one waveguide and a photodetector are connected to a first side of each of the plurality of splitters through which light enters and exits, and
wherein two waveguides are connected to a second side of each of the plurality of splitters and diverge from each of the plurality of splitters.

8. The optical phased array of claim 7, wherein the photodetector connected to the first side of each of the plurality of splitter comprises a first light receiving element and a second light receiving element respectively provided on opposite sides of the one waveguide.

9. The optical phased array of claim 6, wherein the plurality of photodetectors are provided at positions configured to receive light deviated from the plurality of waveguides while light radiated to the antenna array passes through the plurality of splitters through the plurality of waveguides.

10. The optical phased array of claim 6, further comprising a plurality of phase shifters provided between the plurality of splitters.

11. The optical phased array of claim 10, wherein one waveguide and a photodetector are connected to a first side of each of the plurality of splitters through which light enters and exits, and two waveguides are connected to a second side of each of the plurality of splitters and diverge from each of the plurality of splitters, and
wherein each of the plurality of phase shifters is provided in one of the two waveguides diverging from each of the plurality of splitters.

12. The optical phased array of claim 10, wherein a number of the plurality of phase shifters is equal to a number of the plurality of splitters, or the number of the plurality of phase shifters is greater than the number of the plurality of splitters provided between the light injector and the antenna array.

13. The optical phased array of claim 12, wherein, the number of the plurality of phase shifters is greater than the number of the plurality of splitters, and the plurality of phase shifters are provided in each of the plurality of waveguides provided between the first splitter and the antenna array.

14. The optical phased array of claim 10, further comprising heat shielding elements provided around the first phase shifter and each of the plurality of phase shifters.

15. The optical phased array of claim 6, wherein one waveguide is connected to a first side of each of the plurality of splitters through which light enters and exits, and two waveguides are connected to a second side of each of the plurality of splitters and diverge from each of the plurality of splitters, and wherein a tap coupler is provided adjacent to the one waveguide connected to the first side of each of the plurality of splitters.

16. An optical phased array comprising:
a light receiver;
a first splitter connected to the light receiver;
a first phase shifter connected to the first splitter;
a plurality of waveguides connected to the first splitter, portions of the plurality of waveguides being connected to the first splitter via the first phase shifter;
an antenna array connected to the plurality of waveguides; and
a single mode filter provided in each of the plurality of waveguides.

17. The optical phased array of claim 16, wherein the single mode filter is integrated into each of the plurality of waveguides.

18. The optical phased array of claim 17, wherein the single mode filter comprises:
a first section having a first width;
a second section having a second width; and
a third section having a third width;
wherein the first width, the second width, and the third width are different from each other.

19. The optical phased array of claim 16, wherein one waveguide is connected to a first side of the first splitter through which light enters and exits, and two waveguides are connected to a second side of the first splitter and diverge from the first splitter,
wherein the first phase shifter is provided on one of the two waveguides diverging from the first splitter.

20. The optical phased array of claim 16, further comprising:
a plurality of splitters provided between the first splitter and the plurality of waveguides; and
a plurality of photodetectors connected to the plurality of splitters.

21. The optical phased array of claim 20, wherein the plurality of photodetectors are provided at positions configured to receive light deviated from a waveguide while light radiated to the antenna array passes through the plurality of splitters through the plurality of waveguides.

22. The optical phased array of claim 20, wherein one waveguide and a photodetector are connected to a first side of each of the plurality of splitters through which light enters and exits, and two waveguides are connected to a second side of each of the plurality of splitters and diverge from each of the plurality of splitters.

23. The optical phased array of claim 22, wherein the photodetector connected to the first side of each of the plurality of splitters comprises a first light receiving element and a second light receiving element respectively provided on opposite sides of the one waveguide.

24. The optical phased array of claim 20, further comprising a plurality of phase shifters provided between the plurality of splitters.

25. The optical phased array of claim 24, wherein one waveguide and a first photodetector are connected to a first side of each of the plurality of splitters through which light enters and exits, and two waveguides are connected to a second side of each of the plurality of splitters and diverge from each of the plurality of splitters, and
wherein each of the plurality of phase shifters is provided in one of the two waveguides diverging from each of the plurality of splitters.

26. The optical phased array of claim 24, wherein a number of the plurality of phase shifters is equal to a number of the plurality of splitters, or the number of the plurality of phase shifters is greater than the number of the plurality of splitters provided between a light injector and the antenna array.

27. The optical phased array of claim 26, wherein, the number of the plurality of phase shifters is greater than the number of the plurality of splitters, and the plurality of phase shifters are provided in each of the plurality of waveguides provided between the first splitter and the antenna array.

28. The optical phased array of claim 24, further comprising heat shielding elements provided around the first phase shifter and each of the plurality of phase shifters.

29. The optical phased array of claim 20, wherein one waveguide is connected to a first side of each of the plurality of splitters through which light enters and exits, and two waveguides are connected to a second side of each of the plurality of splitters and diverge from each of the plurality of splitters, and wherein a tap coupler is provided adjacent to the one waveguide connected to the first side of each of the plurality of splitters.

\* \* \* \* \*